(12) United States Patent
Sze et al.

(10) Patent No.: US 8,108,818 B2
(45) Date of Patent: Jan. 31, 2012

(54) METHOD AND SYSTEM FOR POINT-TO-POINT FAST DELAY ESTIMATION FOR VLSI CIRCUITS

(75) Inventors: Chin Ngai Sze, Austin, TX (US);
Charles J. Alpert, Cedar Park, TX (US);
Michael D. Moffitt, Austin, TX (US);
Zhuo Li, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 12/363,340

(22) Filed: Jan. 30, 2009

(65) Prior Publication Data

US 2010/0199243 A1    Aug. 5, 2010

(51) Int. Cl.
*G06F 17/50*    (2006.01)
(52) U.S. Cl. ........................ 716/110; 716/114
(58) Field of Classification Search ........... 716/110–114
See application file for complete search history.

(56) References Cited

U.S. PATENT DOCUMENTS

| | | | | |
|---|---|---|---|---|
| 5,475,607 A * | 12/1995 | Apte et al. | ..................... | 716/113 |
| 6,601,223 B1 * | 7/2003 | Puri et al. | ..................... | 716/113 |
| 6,684,373 B1 * | 1/2004 | Bodine et al. | ................. | 716/114 |
| 7,065,730 B2 | 6/2006 | Alpert et al. | | |
| 7,210,005 B2 | 4/2007 | Guha et al. | | |
| 7,213,221 B1 | 5/2007 | Celik et al. | | |
| 7,330,931 B2 | 2/2008 | Guha et al. | | |
| 7,376,924 B2 * | 5/2008 | Curtin et al. | .................. | 716/122 |
| 2008/0126912 A1 | 5/2008 | Zohar et al. | | |

OTHER PUBLICATIONS

Chanseok Hwang, et al., Interconnect Design Methods for Memory Design, Design Automation Conference: Proceedings of the ASP-DAC 2004, Jan. 27-30, 2004, pp. 438-443, Published in: US.
Tim Saxe, et al., Metal Layers a Time to Interconnect Delay?, EETimes, Jun. 23, 2003; www.design-re-use.com/articles/5785/metal-layers-a-key-to-interconnect-delay.html, Published in: US.
Andrew E. Caldwell, et al., On Wirelength Estimations for Row-Based Placement, IEEE Transactions on Computer-Aided Design of Integrated Circuits and Systems, Sep. 1999, pp. 1265-1278, vol. 18, No. 9, Published in: US.
Qingbo Zhu, et al., Reducing Energy Consumption of Disk Storage Using Power-Aware Cache Management, Feb. 14-18, 2004, Publisher: Proceedings of 10th International Symposium on High Performance Computer Architecture, 2004 (HPCA-10).
Jin-Tai Yan, et al.,Timing-Driven Steiner Tree Construction Based on Feasible Assignment of Hidden Steiner Points; IEEE International Symposium on Circuits and Systems (ISCAS), May 23-26, 2005.

(Continued)

*Primary Examiner* — Jack Chiang
*Assistant Examiner* — Binh Tat
(74) *Attorney, Agent, or Firm* — Suiter Swantz pc llo (57) ABSTRACT

The present disclosure is directed to a method for estimating an interconnect delay for a source-to-sink path of a net within a Very Large Scale Integration (VLSI) circuit, the source-to-sink path connecting a source and a sink in the net. The method may comprise estimating a total wire capacitance; calculating a delay contribution based on delay of the source-to-sink path and delay of a plurality of off-path sinks; and estimating the interconnect delay for the source-to-sink path based on the delay contribution.

18 Claims, 5 Drawing Sheets

OTHER PUBLICATIONS

Charles J. Alpert, et al., Timing-Driven Steiner Trees are (Practically) Free; Proceedings of the 43rd Annual Conference on Design Automation, Jul. 24-28, 2006, pp. 389-392, Session 24; Published in: US.

C. Chu; Flute: Fast Lookup Table Based Wirelength Estimation Technique; IEEE/ACM International Conference on Computer Aided Design, Nov. 7-11, 2004, pp. 696-701.

* cited by examiner

METHOD AND SYSTEM FOR POINT-TO-POINT FAST DELAY ESTIMATION FOR VLSI CIRCUITS

TECHNICAL FIELD

The present disclosure generally relates to a method of estimating interconnect delay in an integrated circuit design, and more particularly to a method for estimating interconnect delay in a Very Large Scale Integration (VLSI) circuit.

BACKGROUND

Interconnect delay has moved to the forefront as the limiting factor in integrated circuit performance. The recognition of interconnect delay is increasingly important as advancements in deep-submicron process geometries allow companies to build smaller, faster and less-expensive transistors. By way of example, interconnect delay may account for more than 75 percent of total path delay in a Very Large Scale Integration (VLSI) circuit. Interconnect delay is the time delay from selected input to selected output points along a given interconnect. Interconnect delay demonstrates a degree of resistance, capacitance, and to a considerably lesser degree, inductance. While the impedance might be almost negligible in a single interconnect, even an extremely small value may have a significant effect on the maximum response speed of the circuit. The delay caused by possibly millions of such interconnects in a VLSI circuit may have a profound effect on reducing the maximum operating efficiencies of the integrated circuit.

SUMMARY

Accordingly, an embodiment of the present disclosure is directed to a method for estimating an interconnect delay for a source-to-sink path of a net within a Very Large Scale Integration (VLSI) circuit, the source-to-sink path connecting a source and a sink in the net. The method may comprise calculating an off-path-point that represents all other off-path sinks in the net; projecting an intersect from the off-path-point to the source-to-sink path; estimating a total wire capacitance; calculating a delay contribution based on delay of the source-to-sink path and delay of said all other off-path sinks; and estimating the interconnect delay for the source-to-sink path based on the delay contribution.

A further embodiment of the present disclosure is directed to a method for estimating an interconnect delay for a source-to-sink path of a net within a Very Large Scale Integration (VLSI) circuit, the source-to-sink path connecting a source and a sink in the net. The method may comprise projecting a plurality of off-path sinks to the source-to-sink path; estimating a total wire capacitance; calculating an individual delay contribution for each one of the plurality of off-path sinks; calculating a delay contribution based on delay of the source-to-sink path and delay of the plurality of off-path sinks; and estimating the interconnect delay for the source-to-sink path based on the delay contribution.

A further embodiment of the present disclosure is directed to a computer-readable medium having computer-executable instructions for performing a method for estimating an interconnect delay for a source-to-sink path of a net within a Very Large Scale Integration (VLSI) circuit, the source-to-sink path connecting a source and a sink in the net. The computer-executable instructions for performing the method may comprise estimating a total wire capacitance; calculating a delay contribution based on delay of the source-to-sink path and delay of a plurality of off-path sinks; and estimating the interconnect delay for the source-to-sink path based on the delay contribution.

It is to be understood that both the foregoing general description and the following detailed description are exemplary only and are not necessarily restrictive of the disclosure as claimed. The accompanying drawings, which are incorporated in and constitute a part of the specification, illustrate an embodiment of the disclosure and together with the general description, serve to explain the principles of the disclosure.

BRIEF DESCRIPTION OF THE DRAWINGS

The numerous advantages of the present disclosure may be better understood by those skilled in the art by reference to the accompanying figures in which.

DETAILED DESCRIPTION

Reference will now be made in detail to the subject matter disclosed, which is illustrated in the accompanying drawings.

When designing a new chip or implementing its manufacture, it is oftentimes desirable to determine a maximum clock frequency at which the chip will operate. In order to determine this maximum clock frequency, an interconnect delay effect (among other things) must be predicted. Several methods have been employed by circuit designers to effectively predict the effect of interconnect delay. Because an exact solution of the time delays in interconnects may require the solution to a set of complex differential equations, circuit designers sometimes rely upon simplifications and modeling to come up with timing estimates. One commonly used model represents interconnects as resistors and capacitances in series and parallel. This model produces an RC (Resistance-Capacitance) tree.

An RC tree, or any net topology tree, may be constructed from a design model: a directed graph representing the "netlist" of the logic design, where each pin in an Integrated Circuit (IC) is associated with a "cell". A net may be understood as a set of interconnect segments that transfer the same logic signal from a source to all sinks of the net. Each cell has an associated location, e.g., x,y coordinates of the cell in the IC. Also associated with each cell may be physical information providing cell dimensions and pin offsets relative to the cell origin. The cell location and pin offsets may be combined to determine the locations of each source and sink pin on a net. A net topology tree may then be constructed from this data. The tree may be estimated utilizing, for example, a minimum Steiner tree. Alternatively, an actual or preferred wire route produced by a routing tool may be used. Once a tree has been constructed, an interconnect delay estimator may then use the tree to perform its calculations.

In VLSI physical designs (including floorplan and placement of the designs), one may need to estimate delay of one specific source-to-sink path (e.g., between a specific source to a specific sink) multiple times in order to make optimization decisions. The aforementioned methods may be time consuming for providing such estimations. Therefore, a method for providing point-to-point interconnect delay estimation in a VLSI circuit may be appreciated.

Figure 1:
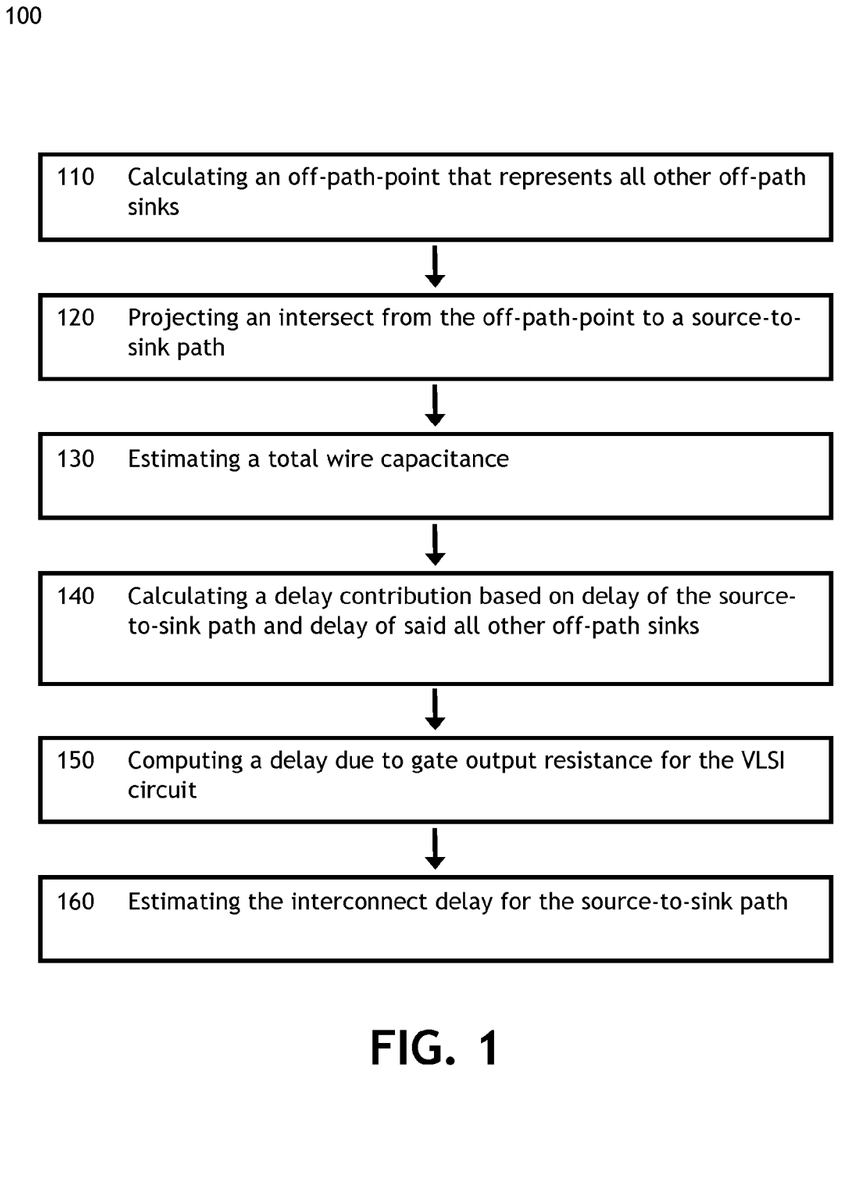
FIG. 1 is a flow diagram illustrating a method for estimating an interconnect delay for an integrated circuit.
Figure 2:
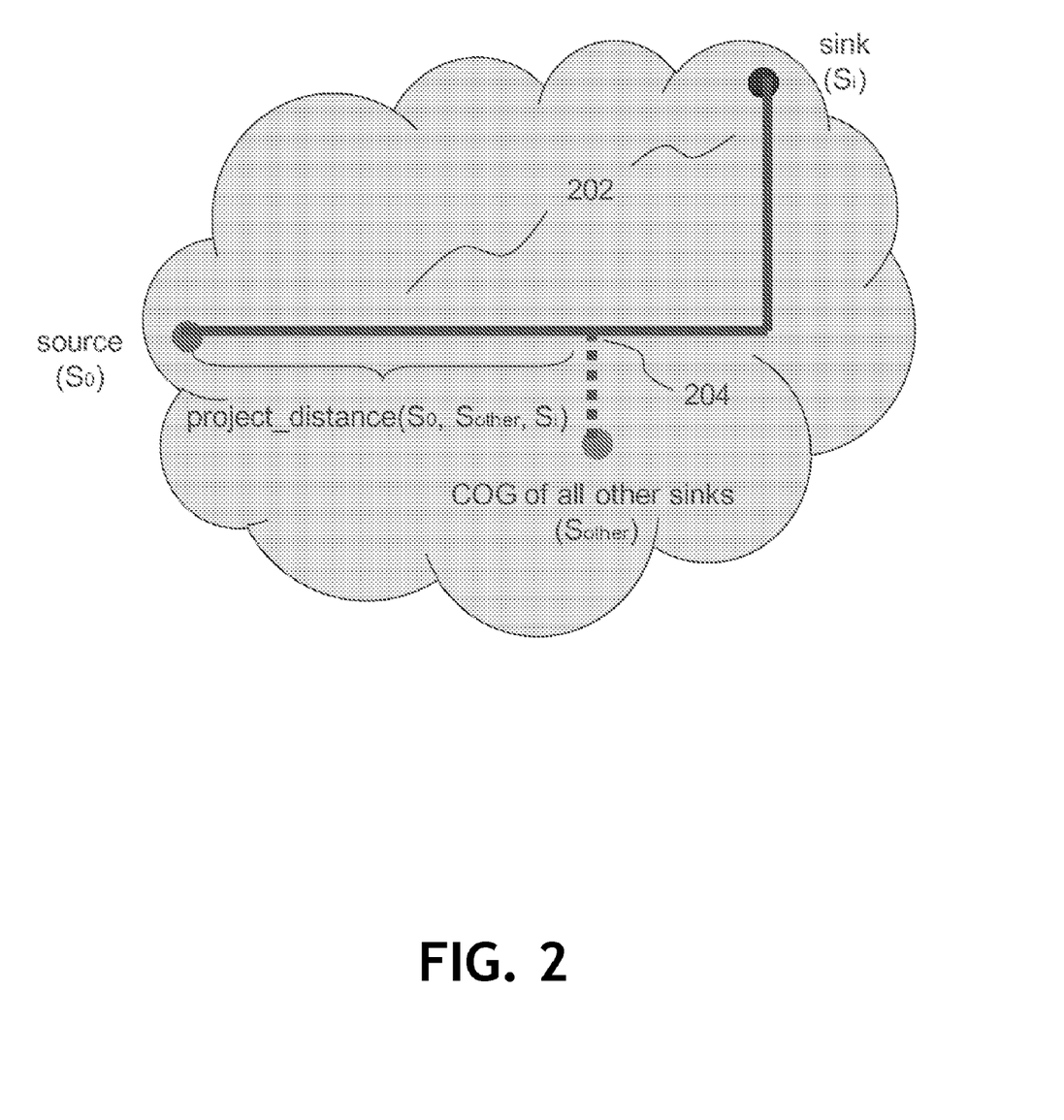
FIG. 2 is an illustration depicting a connection between a specific source and a specific sink among all sinks in a net in an exemplary VLSI circuit.

Referring now to FIGS. 1 and 2. FIG. 1 shows a flow diagram illustrating steps performed by one embodiment of a method 100 in accordance with the present disclosure. The method may be configured for providing accurate and timely interconnect delay estimation in a Very Large Scale Integration (VLSI) circuit. FIG. 2 depicts a connection between a source ($S_0$) and a sink ($S_i$) in an exemplary VLSI circuit. The method 100 may be utilized for estimating an interconnect delay between the source ($S_0$) and the sink ($S_i$) in the VLSI circuit.

For instance, a source-to-sink path 202 of a net of a VLSI circuit may be given/specified. The given source-to-sink path 202 connects a source ($S_0$) and a sink ($S_i$) in the net of the VLSI circuit. It is understood that the source, the sink, and the path 202 depicted in FIG. 2 are merely exemplary; different sources, sinks, and/or paths may be selected/identified for estimation without departing from the scope and spirit of the present disclosure.

In one embodiment, method 100 moves to an operation 110 after a start operation. Operation 110 may calculate an off-path-point ($S_{other}$) that may represent all other off-path sinks in the net of the VLSI circuit. Off-path sinks are all other sinks in the same net that are not on the source-to-sink path 202. In one embodiment, the off-path-point ($S_{other}$) may be calculated as a weighted center of gravity (COG) of all other sinks. The sinks may be uniformly weighted or capacitance weighted for the COG calculation.

Operation 120 may obtain an intersect by projecting the off-path-point to the source-to-sink path. In one embodiment, the intersect may be obtained by finding a bounding box defined by the source ($S_0$) and the sink ($S_i$), and then find a point on the bounding box that is closest to the off-path-point ($S_{other}$). For example, as illustrated in FIG. 2, the intersect is obtained as the closest point 204 from the source-to-sink path 202 (a part of the bounding box) to the COG of the all other sinks ($S_{other}$).

Operation 130 may estimate a total wire capacitance c(T). In one embodiment, the total wire capacitance c(T) may be estimated as c(T)=$C_0$×Total Wire Length, where $C_0$ is the unit wire capacitance (i.e., wire capacitance per unit length), and the Total Wire Length may be estimated utilizing a geometric look-up table as presented by Chu, FLUTE: Fast Lookup Table Based Wirelength Estimation Technique, IEEE International Conference on Computer Aided Design, pages 696-701, November 2004, which is hereby incorporated by reference in its entirety. The geometric look-up table may be utilized directly if the number of pins on the VLSI circuit is less than or equal to 9; otherwise, the sinks may be divided into smaller groups for the look-up table to apply.

Alternatively, the total wire length (TWL) may be estimated based on the formula:

$$TWL = k\sqrt{n \cdot w_R \cdot h_R}$$

where
n is the number of pins on the VLSI circuit;

$$w_R = width \cdot \frac{n+1}{n-1}$$

where width is the width of the VLSI circuit;

$$h_R = height \cdot \frac{n+1}{n-1}$$

where height is the height of the VLSI circuit; and
k is the ratio $$\frac{cost(RMST)}{\sqrt{area \cdot n}}$$

as presented by Caldwell et al., On Wirelength Estimations for Row-based Placement, IEEE Transactions on Computer-Aided Design of Integrated Circuits and Systems, vol. 18, pages 1265-1278, September 1999, which is hereby incorporated by reference in its entirety. As presented by Caldwell et al., the value of k may be obtained from a lookup table based on value of n and aspect ratio $$AR = \max\left(\frac{w_R}{h_R}, \frac{h_R}{w_R}\right).$$

It is contemplated that the total wire length (TWL) may be estimated based on half-perimeter (i.e., $w_R + h_R$) instead of area (i.e., $w_R \cdot h_R$) if the number of pins is less than four (i.e., TWL=$k \cdot \sqrt{n \cdot (w_R + h_R)}$) where n<4). It is understood that the aforementioned formulas are merely one method for estimating the total wire length. Therefore, it is also contemplated that other methods/techniques for estimating the total wire length may be utilized without departing from the scope and spirit of the present disclosure.

Operation 140 may calculate a delay contribution due to the path 202 and delays caused by the off-path sinks. The delay contribution may be calculated by finding a wire resistance, then utilizing total wire capacitance minus source-sink capacitance to find a wire load capacitance and total capacitances of other sinks. For example, in one embodiment, the delay from the source ($S_0$) to the sink ($S_i$) may be calculated based on the formula:

$$Delay(S_0, S_i) = 0.5 \cdot R_0 \cdot C_0 \cdot (distance(S_0, S_i))^2 +$$
$$R_0 \cdot distance(S_0, S_i) \cdot c(S_i) + R_0 \cdot project\_distance$$
$$(S_0, S_{other}, S_i) \cdot \left( c(T) - C_0 \cdot distance(S_0, S_i) + \sum_{j=1\ldots i-1, i+1\ldots n-1} c(S_j) \right)$$

where
$R_0$ is the unit wire resistance (i.e., wire resistance per unit length);
$C_0$ is the unit wire capacitance (i.e., wire capacitance per unit length);
$c(S_i)$ represents the loading capacitance of the sink $S_i$;

c(T) is the total wire capacitance estimated based on formula c(T)=C₀×Total Wire Length as previously described;

$$\sum_{j=1\ldots i-1, i+1\ldots n-1} c(S_j)$$

represents the sum of all other sinks' loading capacitance;
distance($S_0$, $S_i$) represents the measurable distance between the source $S_0$ and the sink $S_i$; and
project_distance($S_0$,$S_{other}$,$S_i$) represents the distance from the source $S_0$ to the intersect 204 projected on to the path 202 (this distance is bounded by distance($S_0$, $S_i$)).

Operation 150 may compute a delay due to gate output resistance (may be referred to as gate delay) for the VLSI circuit. For example, the gate delay may be computed utilizing conventional techniques/methods (e.g., K-factor model or Lumped C method) based on the sum of the total wire capacitance c(T) and all sink capacitances. For instance, the gate delay may be computed as gate delay=gate output resistance×(c(T)+sum of capacitance of all sinks). It is contemplated that the effective capacitance concept may be applied in the gate delay computation as well.

Operation 160 may estimate the interconnect delay between the source $S_0$ and the sink $S_i$. For example, if the only focus is on the wire, then the gate delay may be ignored, and the interconnect delay between the source and the sink may be substantially equal to the sum of delay caused by off-path sinks and delay due to direct connection from source to the specific sink (i.e., estimated interconnect delay equals Delay($S_0$,$S_i$) as calculated in operation 140). In another example, the interconnect delay may be estimated as the sum of Delay($S_0$,$S_i$) and the delay due to gate output resistance (i.e., estimated interconnect delay equals Delay($S_0$,$S_i$)+gate delay). It is understood that the method may be applied to provide estimates for other connections connecting different sources and/or sinks.

Figure 3:
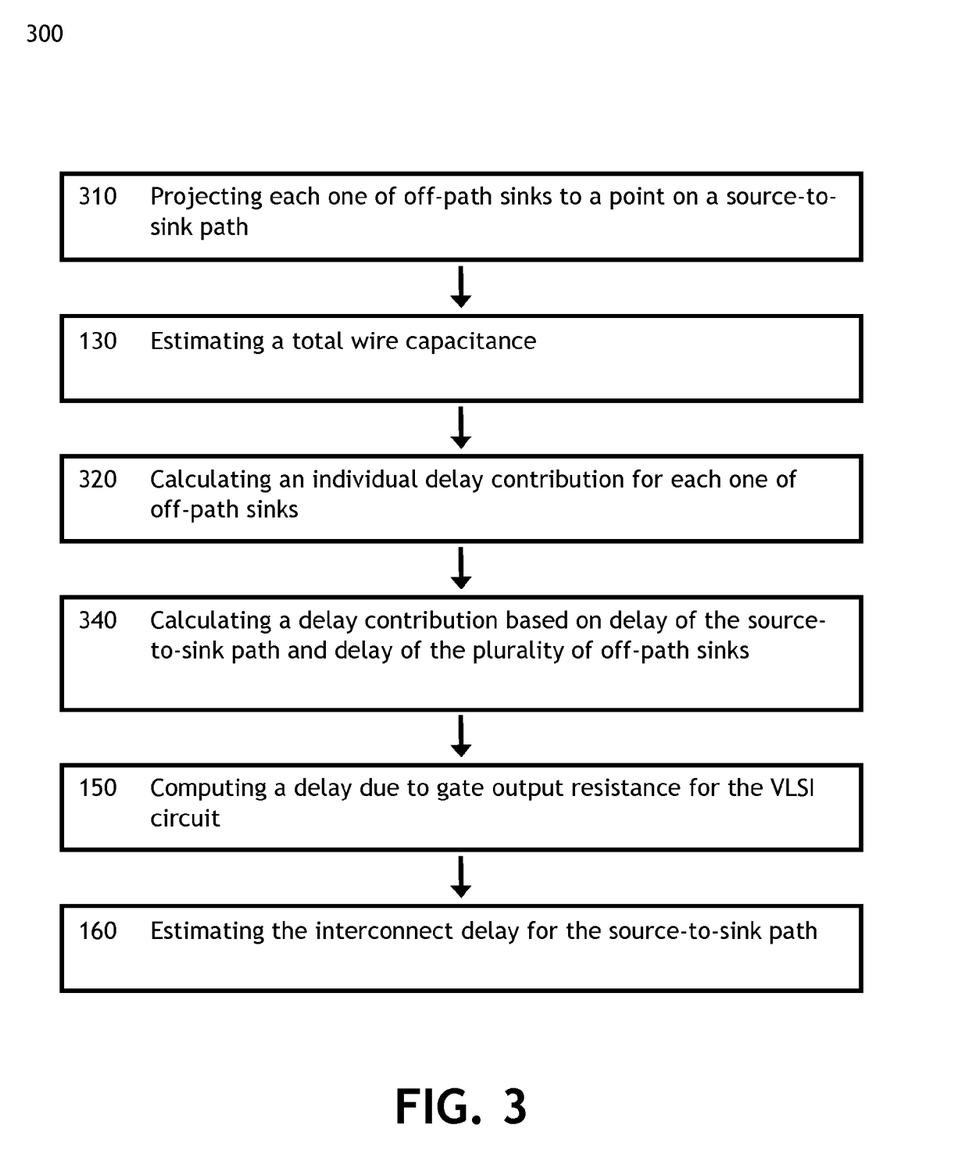
FIG. 3 is another flow diagram illustrating a method for estimating an interconnect delay for an integrated circuit.
Figure 4:
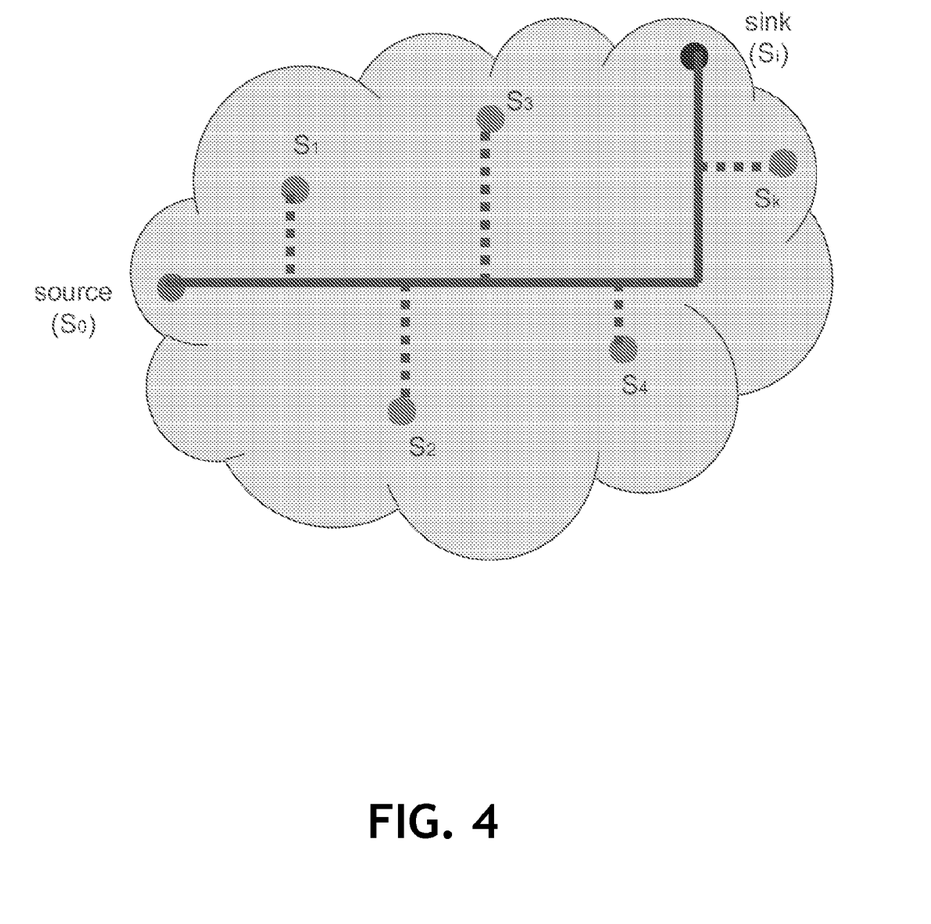
FIG. 4 is another illustration depicting a connection between a source and a sink in an exemplary VLSI circuit.

Referring to FIG. 3, a flow diagram illustrating steps performed by an alternative embodiment of method 300 in accordance with the present disclosure is shown. FIG. 4 depicts a connection between a source ($S_0$) and a sink ($S_i$) in an exemplary VLSI circuit. The method 300 may be utilized for estimating an interconnect delay between the source ($S_0$) and the sink ($S_i$) in the VLSI circuit.

In this embodiment, method 300 moves to an operation 310 after a start operation. Based on the source-to-sink path given/specified, operations may be carried out to determine a delay contributed by all other off-path sinks without calculating an off-path-point ($S_{other}$). For example, operation 310 may project each off-path sink to a point on the source-to-sink path. In this example, as illustrated in FIG. 4, instead of finding a COG point representing all off-patch sinks, an off-path sink $S_1$, $S_2$ . . . $S_k$ may be directly projected on to the path.

Operation 130 may estimate a total wire capacitance c(T), and operation 320 may calculate an individual delay contributed by each off-path sink based on the projection of this particular off-path sink (e.g., utilizing conventional methods/techniques for delay calculation based on the projected points). Operation 340 may then calculate a total delay contributed by all off-path sinks (e.g., the total delay contributed may be calculated as a sum of all individual delay contributions).

Method 300 may comprise operation 150 for computing a delay due to gate output resistance (may be referred to as gate delay) for the VLSI circuit. In addition, operation 160 may estimate the interconnect delay between the source $S_0$ and the sink $S_i$. For example, if the only focus is on the wire, then the gate delay may be ignored, and the interconnect delay between the source and the sink may substantially equal to the delay caused by off-path sinks (i.e., the delay calculated in operation 340). In another example, the interconnect delay may be estimated as the sum of the delay contribution and the gate delay (i.e., Delay($S_0$,$S_i$)+gate delay).

It is contemplated that additional alternative embodiment of the method may be utilized for estimating an interconnect delay for a source-to-sink path. For example, the set of all off-path sinks may be divided into multiple subsets based on their location on the circuitry. Each subset may calculate its own off-path-point (e.g., COG of the subset) to represent that particular subset. These off-path-points may be projected to the source-to-sink path and utilized for estimating the interconnect delay.

Figure 5:
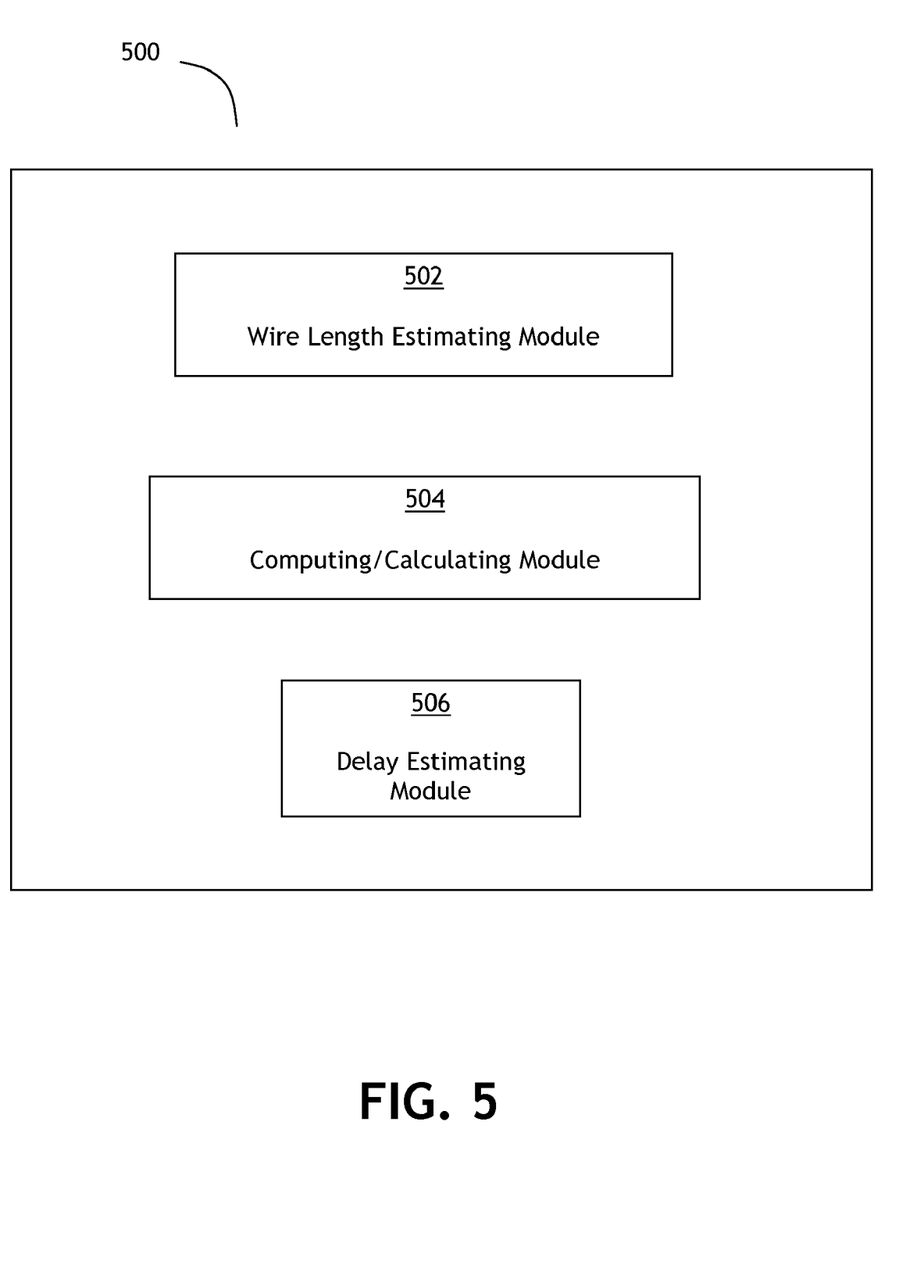
FIG. 5 is a block diagram illustrating a system for estimating an interconnect delay for an integrated circuit.

Referring to FIG. 5, a block diagram illustrating a system 500 for estimating an interconnect delay for an integrated circuit is shown. The system 500 may comprise a wire length estimating module 502 configured for estimating a total wire length. A computing/calculating module 504 may be configured for performing various computations. Such computations may include, for example, calculating an off-path-point ($S_{other}$), calculating a delay contribution caused by all off-path sinks, computing a gate delay for the VLSI circuit, and/or calculating an individual delay contributed by each off-path sink. A delay estimating module 506 may be configured for estimating the interconnect delay based on the delay contribution and optionally the gate delay (based on estimation requirements).

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method, performed by a processor executing non-transitory computer usable program code, for estimating an interconnect delay for a source-to-sink path of a net within a Very Large Scale Integration (VLSI) circuit, the source-to-sink path connecting a source and a sink in the net, comprising:
   calculating by the processer an off-path-point that represents all other off-path sinks in the net;
   projecting an intersect from the off-path-point to the source-to-sink path;
   estimating a total wire capacitance;
   calculating a delay contribution based on delay of the source-to-sink path and delay of said all other off-path sinks; and estimating the interconnect delay for the source-to-sink path based on the delay, wherein calculating a delay contribution based on delay of the source-to-sink path and delay of said art other off-path sinks comprises:
calculating the delay contribution according to the formula $$\text{Delay}(S_0, S_i) = 0.5 \cdot R_0 \cdot C_0 \cdot (\text{distance}(S_0, S_i))^2 +$$
$$R_0 \cdot \text{distance}(S_0, S_i) \cdot c(S_i) + R_0 \cdot \text{project\_distance}(S_0, S_{other}, S_i) \cdot$$
$$\left( c(T) - C_0 \cdot \text{distance}(S_0, S_i) + \sum_{j=1\ldots i-1, i+1\ldots n-1} c(S_j) \right).$$

2. The method as claimed in claim 1, further comprising:
computing a delay due to gate output resistance for the VLSI circuit; and
refining the estimated interconnect delay for the source-to-sink path based on the delay contribution and the delay due to gate output resistance.

3. The method as claimed in claim 1, wherein calculating an off-path-point that represents all other off-path sinks in the net comprises:
computing a center of gravity of all other sinks.

4. The method as claimed in claim 1, wherein calculating an off-path-point that represents all other off-path sinks in the net comprises:
calculating a weighted center of gravity utilizing at least one of uniform weighting of all other sinks or capacitance weighting of all other sinks.

5. The method as claimed in claim 1, wherein estimating a total wire capacitance comprises:
estimating the total wire capacitance according to formula $c(T) = C_0 \times \text{Total Wire Length}$.

6. The method as claimed in claim 5, wherein the total wire length is estimated according to formula $$TWL = \begin{cases} k \cdot \sqrt{n \cdot w_R \cdot h_R} & \text{when } n \geq 4 \\ k \cdot \sqrt{n \cdot (w_R \cdot h_R)} & \text{when } n < 4. \end{cases}$$

7. A method, performed by a processor executing non-transitory computer usable program code, for estimating an interconnect delay for a source-to-sink path of a net within a Very Large Scale Integration (VLSI) circuit, the source-to-sink path connecting a source and a sink in the net, comprising:
projecting a plurality of off-path sinks to the source-to-sink path;
estimating a total wire capacitance;
calculating by the processer an individual delay contribution for each one of the plurality of off-path sinks;
calculating a delay contribution based on delay of the source-to-sink path and delay of the plurality of off-path sinks;
estimating the interconnect delay for the source-to-sink path based on the delay, wherein calculating a delay contribution based on delay of the source-to-sink path and delay of said art other off-path sinks comprises:
calculating the delay contribution according to the formula $$\text{Delay}(S_0, S_i) = 0.5 \cdot R_0 \cdot C_0 \cdot (\text{distance}(S_0, S_i))^2 +$$
$$R_0 \cdot \text{distance}(S_0, S_i) \cdot c(S_i) + R_0 \cdot \text{project\_distance}(S_0, S_{other}, S_i) \cdot$$
$$\left( c(T) - C_0 \cdot \text{distance}(S_0, S_i) + \sum_{j=1\ldots i-1, i+1\ldots n-1} c(S_j) \right).$$

8. The method as claimed in claim 7, further comprising:
computing a delay due to gate output resistance for the VLSI circuit; and
refining the estimated interconnect delay for the source-to-sink path based on the delay contribution and the delay due to gate output resistance.

9. The method as claimed in claim 8, wherein estimating a total wire capacitance comprises:
estimating the total wire capacitance according to formula $c(T) = C_0 \times \text{Total Wire Length}$.

10. The method as claimed in claim 9, wherein the total wire length is estimated according to formula $$TWL = \begin{cases} k \cdot \sqrt{n \cdot w_R \cdot h_R} & \text{when } n \geq 4 \\ k \cdot \sqrt{n \cdot (w_R \cdot h_R)} & \text{when } n < 4. \end{cases}$$

11. A non-transitory computer-readable medium having computer-executable instructions for performing a method for estimating an interconnect delay for a source-to-sink path of a net within a Very Large Scale Integration (VLSI) circuit, the source-to-sink path connecting a source and a sink in the net, comprising:
estimating a total wire capacitance;
calculating a delay contribution based on delay of the source-to-sink path and delay of a plurality of off-path sinks; and
estimating the interconnect delay for the source-to-sink path based on the delay, wherein calculating a delay contribution based on delay of the source-to-sink path and delay of a plurality of off-path sinks comprises:
calculating the delay contribution according to formula $$\text{Delay}(S_0, S_i) = 0.5 - R_0 \cdot C_0 \cdot (\text{distances}(S_0, S_i))^2 +$$
$$R_0 \cdot \text{distance}(S_0, S_i) \cdot c(S_i) + R_0 \cdot \text{project\_distance}(S_0, S_{other}, S_i) \cdot$$
$$\left( c(T) - C_0 \cdot \text{distance}(S_0, S_i) + \sum_{j=1\ldots i-1, i+1\ldots n-1} c(S_j) \right).$$

12. The method as claimed in claim 11, further comprising:
computing a delay due to gate output resistance for the VLSI circuit; and
refining the estimated interconnect delay for the source-to-sink path based on the delay contribution and the delay due to gate output resistance.

13. The method as claimed in claim 11, wherein estimating a total wire capacitance comprises:
estimating the total wire capacitance according to formula $c(T) = C_0 \times \text{Total Wire Length}$.

14. The method as claimed in claim 13, wherein the total wire length is estimated according to formula $$TWL = \begin{cases} k \cdot \sqrt{n \cdot w_R \cdot h_R} & \text{when } n \geq 4 \\ k \cdot \sqrt{n \cdot (w_R \cdot h_R)} & \text{when } n < 4. \end{cases}$$

15. The non-transitory computer-readable medium having computer-executable instructions for performing a method as claimed in claim 11, wherein calculating a delay contribution based on delay of the source-to-sink path and delay of a plurality of off-path sinks comprises:
- calculating an off-path-point that represents all other off-path sinks in the net;
- projecting an intersect from the off-path-point to the source-to-sink path; and
- calculating a delay contribution based on delay of the source-to-sink path and delay of all other off-path sinks.

16. The method as claimed in claim 15, wherein calculating an off-path-point that represents all other off-path sinks in the net comprises:
- computing a center of gravity of all other sinks.

17. The method as claimed in claim 15, wherein calculating an off-path-point that represents all other off-path sinks in the net comprises:
- calculating a weighted center of gravity utilizing at least one of uniform weighting of all other sinks or capacitance weighting of all other sinks.

18. The computer-readable medium having computer-executable instructions for performing a method as claimed in claim 11, wherein calculating a delay contribution based on delay of the source-to-sink path and delay of a plurality of off-path sinks comprises:
- projecting the plurality of off-path sinks to the source-to-sink path;
- calculating an individual delay contribution for each one of the plurality of off-path sinks; and
- calculating a delay contribution based on delay of the source-to-sink path and delay of the plurality of off-path sinks based on the individual delay contribution for each one of the plurality of off-path sinks.

* * * * *